(12) United States Patent
Lapir et al.

(10) Patent No.: US 6,983,345 B2
(45) Date of Patent: Jan. 3, 2006

(54) ASSOCIATIVE MEMORY

(75) Inventors: Gannady Lapir, Innovationspark Rahms (DE); Harry Urbschat, Innovationspark Rahms (DE)

(73) Assignee: SER Solutions, Inc., Dulles, VA (US)

( * ) Notice: Subject to any disclaimer, the term of this patent is extended or adjusted under 35 U.S.C. 154(b) by 218 days.

(21) Appl. No.: 10/362,027

(22) PCT Filed: Aug. 20, 2001

(86) PCT No.: PCT/EP01/09577

§ 371 (c)(1),
(2), (4) Date: Oct. 7, 2003

(87) PCT Pub. No.: WO02/15045

PCT Pub. Date: Feb. 21, 2002

(65) Prior Publication Data

US 2004/0054666 A1    Mar. 18, 2004

(51) Int. Cl.
G06F 12/00 (2006.01)
(52) U.S. Cl. .................... 711/108; 711/5; 711/104; 711/105; 711/161; 711/170; 707/1; 707/3; 707/6; 707/101; 707/102; 707/104.1
(58) Field of Classification Search ............... 365/45, 365/49; 711/1–10, 101, 104–105, 108, 111, 711/154; 707/1–10, 101–102
See application file for complete search history.

(56) References Cited

U.S. PATENT DOCUMENTS

| 5,245,672 A | * | 9/1993 | Wilson et al. ............ 382/179 |
| 5,778,362 A | * | 7/1998 | Deerwester ................. 707/5 |
| 6,289,334 B1 | * | 9/2001 | Reiner et al. ............... 707/3 |

FOREIGN PATENT DOCUMENTS

WO    WO 98/47081    10/1998

OTHER PUBLICATIONS

Hattori, M, May 4–9, 1998, IEEE, vol. 1, pp.: 531-536.*

* cited by examiner

*Primary Examiner*—Donald Sparks
*Assistant Examiner*—Hashem Farrokh
(74) *Attorney, Agent, or Firm*—Fulbright & Jaworski LLP

(57) ABSTRACT

A computer-implemented method of realizing an associative memory capable of storing a set of documents and retrieving one or more stored documents similar to an inputted query document, said method comprising: coding each document or a part of it through a corresponding feature vector consisting of a series of bits which respectively code for the presence or absence of certain features in said document; arranging the feature vectors in a matrix; generating a query feature vector based on the query document and according to the rules used for generating the feature vectors corresponding to the stored documents such that the query vector corresponds in its length to the width of the matrix; storing the matrix column-wise; for those columns of the matrix where the query vector indicates the presence of a feature, bitwise performing one or more of preferably hardware supported logical operations between the columns of the matrix to obtain one or more additional result columns coding for a similarity measure between the query and parts or the whole of the stored documents; and said method further comprising one or a combination of the following: retrieval of one or more stores documents based on the obtained similarity measure; and or storing a representation of a document through its feature vector into the above matrix.

16 Claims, 3 Drawing Sheets

Fig. 2

ASSOCIATIVE MEMORY

Figure 1:
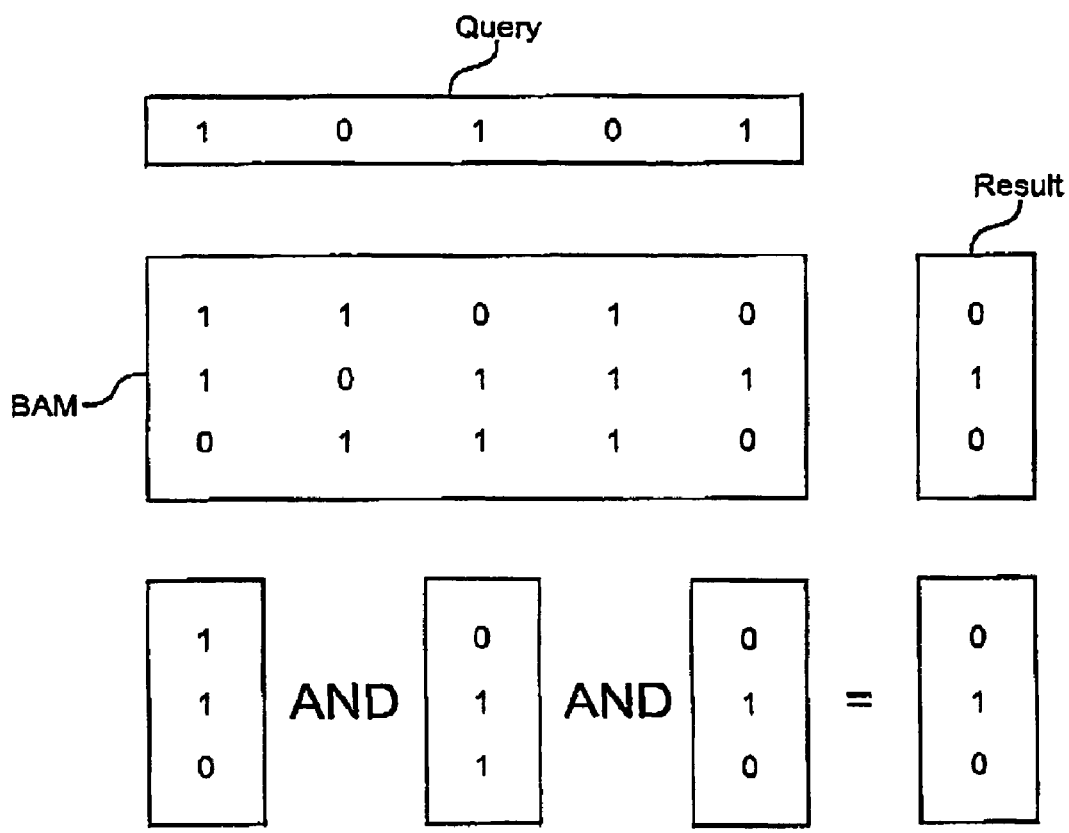

This application is a national stage filing under 35 U.S.C. §371 of international application No. PCT/EP01/09577 filed Aug. 20, 2001 incorporated in its entirely by reference.

FIELD OF THE INVENTION

The present invention relates to an associative memory, and in particular to the retrieving and storing using such an associative memory.

DESCRIPTION OF THE RELATED ART

Learning is the ability of an organism or artificial system to acquire and store (memorize) environmental information whose content cannot not predefined through genetic or deterministic rules. This definition shows that learning is closely related to storing and retrieving information.

Living beings MUST have good developed mechanisms for this task: indeed, biological entities like the human brain and immune system are the best known examples proving the existence of efficient "algorithms".

Many biologists consider the question of memory as the brain's "Rosetta Stone": a well defined riddle, which when answered opens the way to understanding other cognitive functions as well. Although modern experimental techniques like NMR (nuclear magnetic resonance) allow a direct imaging of brain activity, it is almost sure that the human memory is not strongly localized. The idea that when I recognize my grandmother a certain neuron in my brain becomes active—the so-called "grandmother neuron" hypothesis—has been given up long time ago.

When asked when I met Mr. XYZ for the first time one can give a correct answer in a few hundred milliseconds time, while "searching" through millions of similar and billions of different memory traces. And all this is done with the help of very (many millions of) sluggish cells, whose typical response time is well above 1 millisecond.

What is the secret of this fantastic database? Of course, we do not know it yet but certain features have been unmistakably already been identified.

These can be summed together as a set of requirements such a memory device should have:

The data is stored in a distributed fashion: a text string would be stored as a certain configuration of features (set bits) which, however, are distributed more or less randomly over the whole system.

Therefore, even if some part of the system is destroyed (the brain is slightly injured), an imperfect image of the original can be still retrieved (the system is said to be fault tolerant).

The data is recovered solely based on its content, not on its address (remember, the system does not have addresses at all).

The data is strongly related to other such patterns through associations.

The writing, association, and reading mechanisms are parallel, independent processes.

An associative memory would desirably fulfill all these conditions: it is parallel distributed, content addressable, and robust (failure tolerant).

Some existing models of associative memories are now briefly described in the following.

The basic approach of the so-called Kohonen network is that the neurons perform automatically a kind of clustering of the input features and reduce at same time the dimensionality of the input.

Assume that the objects we are describing have some characteristic features—for our purposes it is enough to represent them as a set of such features. If we talk about a ball, for instance, such features could be the radius, the material is made from, its color, and perhaps the kind of sport it is used for.

If we take a piece of text, such features could be the language, the length, and the number of words in the text.

Therefore, one instance of the analyzed objects is described by a feature to vector of 3, 4 or 100 dimensions. This is the feature space of the objects.

Next, let us assume that there is a two-dimensional square lattice of 16 neurons, which should somehow "learn" to represent this high dimensional feature space. This is the neuronal space.

Kohonen's algorithm defines for each neuron an internal "storage" whose dimension equals that of the feature space and a procedure of "training" the neuronal system by presenting at random example objects in feature space.

As a result, we obtain a set of cluster centers (the neurons), being responsible for a whole region of objects in feature space. Note that the duster centers are living in to dimensions, making a graphical representation of high dimensional featured objects possible. The Kohonen algorithm unifies clustering (or vector quantization) with dimensionality scaling. Next, the cluster centers can be associated with some operational maps. The Kohonen maps have been used most often to associate sensory maps (the visual input of a robot) to motoric maps (the motoric output controlling the robot's motion).

Another typical model is the Hopfield (CalTech) model for autoassociative memory, developed in the early 80's. This model is based very strongly on physical analogies and on the concept of energy, Everybody knows that if you throw a ball into a hole, the ball will eventually settle down at the bottom of this hole. A physical system is said to be in its ground state if it approaches the state of minimal (potential) energy.

Hopfields idea was to "create" (learn) a whole energy landscape with holes of equal depth. If we throw a ball into this system, it will rest on the bottom of one of these holes.

If we throw the ball not very far away from the bottom of a hole, it will go there. The difficult problem in this simple idea is how to define the holes such that the bottom corresponds to useful information, or a special combination of features which are defined by some examples given to the system. Then slightly perturbed variants of this pattern will all "relax" to the good pattern. Such automatic correction mechanisms are, of course, very useful in associating input patterns to some predefined "representant" or "canonical" pattern. The Hopfield model has a very simple learning rule but is not particularly fast or scalable.

Another known approach of associative search is based on representing documents as bitstrings and searching for those documents where certain bits as defined in a query string are set. Such a method is e.g. described in "Managing Gigabytes", by Witten et al (Morgan Kaufmann Publ, 1999), on pages 128 through 142.

It is an object of the present invention to provide an associative memory which is efficient and flexible in retrieving and/or storing.

SUMMARY OF THE INVENTION

According to the present invention there is provided an associative memory which is capable of retrieving documents in response to an input query based on a similarity measure evaluating the similarity between the query and the documents stored in the associative memory. Arranging the memory in a matrix, performing logical operations based on the columns of the matrix identified by the query, and thereby obtaining a plurality of result columns coding for a similarity measure enables to identify documents together with a similarity degree for the similarity between the documents and the query.

Preferably the logical operations are hardware supported operations (Boolean operations supported by a microprocessor for its register content), thereby the operation becomes very fast.

Preferably the matrix is stored columnwise, this makes access to those columns identified by a query very fast.

DETAILED DESCRIPTION

One embodiment of the present invention is an implementation of a "searching through example" protocol: given a document which is chosen by the user as to contain the type of content she is searching for, the system finds the best fitting—and if required—all documents which are similar to the example. In general, finding similar objects to a given one involves the definition (and computation) of some similarity measure, If we wish to retrieve some information based on its content rather than based on some search key or memory address, we must first represent the document's information. The term document as used in the following may mean a whole file or text document, or a fraction of a whole document such as a page, a paragraph, or any smaller unit of the whole document.

Before pattern recognition methods can be applied we have to express usual text into some typical features. In an embodiment of the present invention there are two types of features: one expressing orthographic and a second one expressing meaning (semantic) similarity. The semantic similarity is enforced through a "semantic class table", which expresses each word as a set of the concept classes it belongs to. In the present embodiment this is done by representing the text of a document through a coding which codes for the presence or absence for certain trigram in the document text. Assuming 32 possible character this leads to $32^3$ possible trigrams requiring a bitstring of the length $32^3$. Each trigram is assigned a certain number, and if the text document contains a certain trigram being numbered n then the n-th bit in the bitstring will be set. This results in a bitstring having $32^3$ bits which codes for the presence or absence of certain trigrams in the text.

It will readily be understood that this is only one possible feature coding, other features such as unigrams, digrams, words, et cetera could be coded as well for their presence or absence through a bitstring generated in a similar manner.

The system may of course use also a combination of different representations of such text, such as a combination of digrams and trigrams.

As an example the term "extension" consists of the monograms "e"+"x"+"t"+"n"+"s"+"l"+"o"+"n", the digrams "ex"+"xt"+"te"+"en"+"ns"+"si"+"io"+"on", etc.

Note that once coded in this way we loose information about how many times a letter, digram, etc. and in what order they occurred in the corresponding word. However, if these features are quite different we can be sure that the corresponding words are also quite different inversely, if two feature vectors are similar this does not automatically mean that the underlying text IS necessarily identical.

There is still a further possibility as to which type of features can be coded for their presence or their absence. One example is to use the semantics of the words contained in a text. For that purpose e.g. there are compiled lists of words which are similar or identical their meaning and such groups of words of respectively similar or identical meanings then belong to the same group or "class"(semantical class).

One such class could e.g. comprise the words chair, seat, bank sofa. They all have the same or at least a similar meaning in the sense that they are things on which one can sit down.

Another group or class could then comprise e.g. the words door, gate, entry. They all are similar in the sense that one can enter some place through the entities which belong to this group or class.

One can compile several of those groups or classes, and after they have been compiled one then can check whether in the text there are occurring words belonging to one or more of the classes. Based on whether or not words of a certain class occur in the text the feature vector is formed, e.g. if words belonging to class 3, 5, 17 an 23 occur in the text then the corresponding bits in the feature is vector are set. The feature vector thereby in one embodiment has at least as many bits as classes have been compiled.

The classes themselves and their organizational scheme can largely depend on the definitions chosen, i.e. which type of classes have been compiled and how many of them. There may be classes which are formed very narrowly such that they contain only synonyms, and other ones which contain words which are similar or correlated on a much more abstract level, e.g. in the sense that they relate to the same general field such as economics, sports, science, et cetera.

Such more abstract "concept classes" represent meaning of the text in a more abstract manner than individual words do. Based on this concept different hierarchical levels of such "concept classes" can be compiled, and they all may be taken into account when forming the "final" feature venture coding for the features occurring in the text document. This means that the final feature vector may have one bit for each.

It should be understood that the possible ways of coding for the presence or absence of features as described above can be used alternatively, but they can also be used in combination as well. Depending of the type and the number of features which are to be coded the feature vector may become very long.

After having described several possibilities how the feature vector can be formed, it will now be described how it can be employed for search and retrieval.

The representation of text through a feature vector as described before is applied to retrieve based on a query document similar documents from a database. For that purpose the query document (or query text) as well as the documents of the database which is searched are represented through corresponding feature vectors as will be explained in more detail below. The documents to be searched (or better: their corresponding feature vectors) are arranged in form of a matrix, and the query document also is expressed as its corresponding feature vector.

In one embodiment, in a first step, it is tried to eliminate non relevant documents. This is done by logical operations on those matrix columns identified by the query. This results in a set of candidates together with a corresponding similarity measure. Based on this similarity measure there is obtained a reduced set of candidates, e.g. by selecting only the most relevant candidates having the highest similarity measure.

This operation still is based on logical operations on the matrix to thereby obtain the reduced set of candidates.

In a further embodiment, after having reduced the data to a small number of potential candidates there is made an attempt to measure the similarity between the query and the candidate documents based on the actual textual content of the query and the reduced set of document candidates. This is the second phase.

In a further embodiment both approaches are combined and executed consecutively.

As explained before, the already stored documents which are to be searched and the query document are to be represented by corresponding feature vectors arranged in a matrix. For large documents stored this can be done by dividing them into smaller units of some defined length which then are individually represented through their feature vectors, E.g., in one embodiment a document is seen as a hierarchically structured set of smaller objects. Take for instance a typical press article or web page. These documents consist of several units we call pages, each of about 1 Kbytes size. This corresponds in length to one to two paragraphs.

One may expect that this unit is small enough so that its content is more or less unique in its topic; only a single topic or idea is expressed in it. A page is itself a collection of so-called fragments, whose length is a free parameter selectable by the user) but lies around 32 bytes (letters). The fragments are usually containing one or more words. The method of representation through bitstrings can be applied to any of these units, in the following we just for example choose as a unit a so-called page (about 1 kbyte). Each page is stored as a representation its features through a feature vector. For simplicity we here assume that in this embodiment the feature vector only codes for the presence or absence of trigrams. Thereby a matrix is formed, the so-called bit attribute matrix in which one row is a feature vector coding for the features of a corresponding page.

As already mentioned, in one embodiment there can be implemented in software an associative memory based on a representation through feature vectors, their arrangement in a matrix together with a query document and subsequently the performance of logical operations thereupon. Indeed, it can be shown that all computable functions can be mapped into a sequence of two operations: selecting a number of columns of a matrix representation of the stored documents and performing an arbitrary logical bit-by-bit operations on the selected columns. In the following we consider in somewhat more detail an example of such a matrix representation.

TABLE 1

| url 1 | this is the text of the first page | 01010101010000010101000010100101010101 |
|---|---|---|
| url 2 | this is the text of the secnd page | 00011111000010101000101010101000001001000 |
| url 3 | Yet another page of the document | 01010000000010100010010000100100001000100 |

The table shows a small portion of the so-called bit-attribute matrix. The coding (bitstrings) is only schematic.

If we have a method to map a page of text into a characteristic set coding for the presence (absence) of a certain feature, then we can map the pages into the structure shown in Table 1 called the Bit-Attribute-Matrix (BAM). Note that each row here corresponds exactly to a page of text (in other embodiments this correspondence may be to another unit of text such as a certain number of words or characters) and there is an associated reference pointer (or URL) associated to each, allowing one to retrieve later the whole text.

The coding in the present embodiment represents the presence or absence of trigrams in the text, whereas each possible trigram is assigned an identification number. The bit string may then have the length corresponding to the number of possible trigrams, and if a certain trigram is present in the text, then the corresponding bit in the bit string is set to one.

A more efficient way is to fold the range of possible ID-numbers to a smaller one, e.g. by dividing the ID-number for a trigram which is present in the page by a certain number, preferably a prime number, thereby obtaining a smaller ID-number and a correspondingly smaller bit string in which the bit corresponding to the smaller number is set if the feature is present in the text. This involves a loss of information due to the fact that more than one feature may be represented by the same bit or column, however it reduces the necessary memory space.

The BAM has a width defined by the system parameters which define how the presence or absence of certain features is coded. It has a height which equals the number of pages we have to store (and which are to be searched). Any query will be also brought into this standard feature format. This means any query text is also represented through a bitstring which has been generated using the same coding scheme as used for generating the BAM.

It should be understood that the formation of the bitstrings and the corresponding bit attribute matrix can be based on any features which somehow represent the content of the text to be represented, and it can also be based on any combination of such features. E.g. the bitstring could be formed by a concatenation of a part coding for digrams, a part coding for trigrams, a part coding for semantic content as represented through semantic classes explained before, and so on. Depending on which features are chosen to form the bit attribute matrix its size changes, as can be understood from the foregoing, and the size of the query document consequently changes as well, because the bitstring representing the query document is formed based on the same rules as the rows of the bit attribute matrix representing the documents to be searched.

Now the query process itself will be explained in somewhat more detail with reference to FIG. 1. The 1's of the query bitstring tell us which columns of the BAM should be investigated. Hence, the selection process is defined by a horizontal "register" of the same width as the BAM, in which the query is stored and whose set elements indicate a relevant column. The selected columns are shown in FIG. 1 below the bit attribute matrix. For the columns selected then there is carried out an adding with a bit-by-bit AND in sequential order for the selected columns. The result is stored in an additional vertical register shown on the right-hand of FIG. 1. It is easy to see that in each AND-step the number of selected rows will roughly decrease by the amount of zeros in one selected column. If the search is exact, we will keep in the end only those rows, which survived the AND-ing operations. This means that only those pages which have all the features of the query will show up in the result column. Based on the result column the corresponding document(s) then can be retrieved.

FIG. 1 schematically illustrates this process. For purposes of the present illustration only the BAM is extremely small. The query selects columns 1, 3, and 5, the are ANDed as indicated in the lower part of FIG. 1 to obtain the result column.

Figure 2:
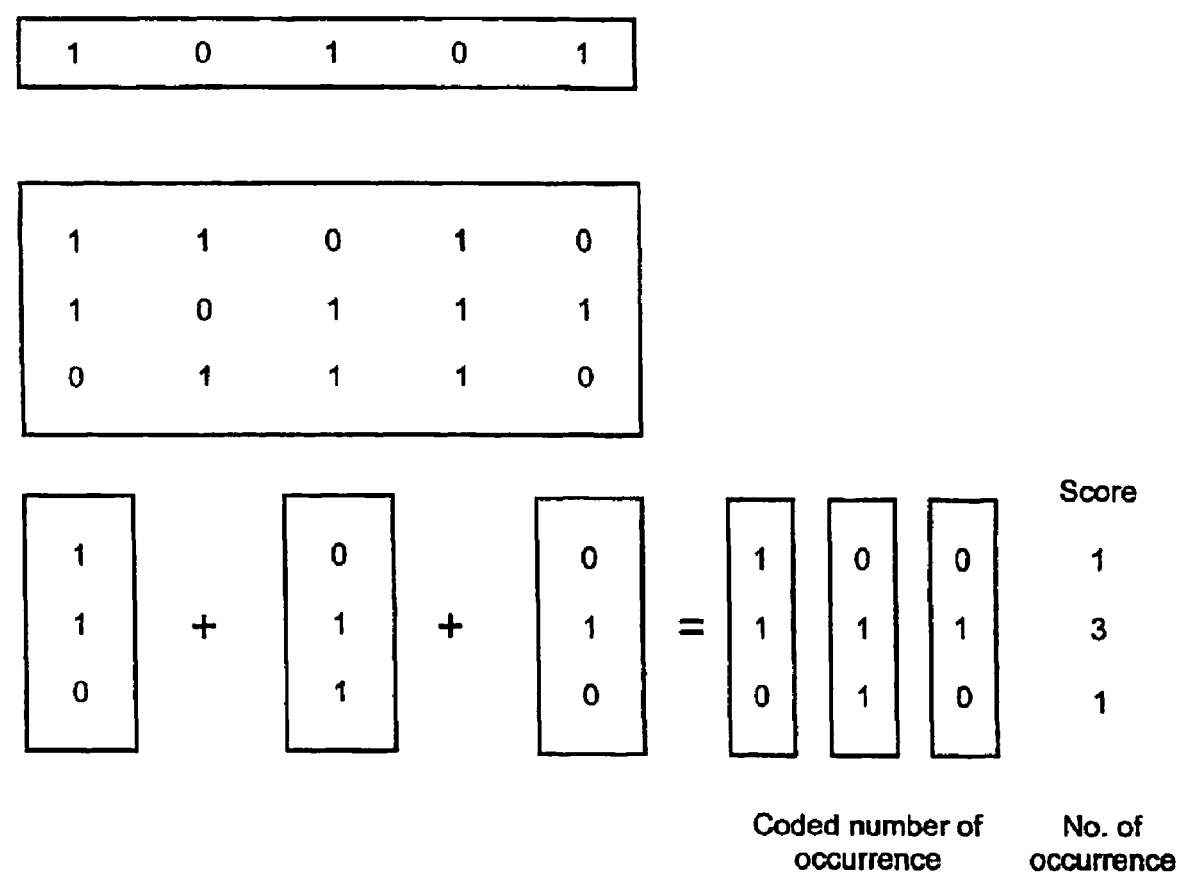

If e.g. In a further embodiment the search is to allow orthographic errors (or non-exact occurrence of certain features defined by the query), one can keep in further vertical registers the results of adding page penalties as shown e.g. In FIG. 2. This can be done by e.g. counting for a certain row of the matrix the number of logical ones which appear in the positions indicated by the query string. The result may then be stored in a vertical coded form in a plurality of result columns. To one row of the matrix then there belong multiple result bits which can be evaluated in order to perform a selection of the candidates.

The result columns again form a result matrix, and one row of the result matrix consists of a sequence of bits which may represent a coding of the frequency of occurrence of logical ones in the rows of the matrix at the positions indicated through the query string. For the example of FIG. 1 this is schematically illustrated in FIG. 2. The result columns code for the number of occurrence of 1's, as can be easily seen from FIG. 2.

In a further embodiment, the coding may not be a coding of the absolute number of occurrence, but it is also possible to code whether the number of ones lies in a certain range of occurrence frequency. Assume which have two result columns, then in total four ranges can be mapped, and then if the maximum possible occurrence is e.g. N, then 0 to N/4 may be mapped into range 1, from N/4+1 until N/2 may be mapped into range 2, and so on.

More complicated coding schemes are of course also possible. However, the result columns may always be obtained by performing one or more logical operations on the selected columns of the matrix, thereby enabling them to be efficiently carried out through hardware supported operations, such as microprocessor operations on registers.

Thereby a score for a document unit (here a page) can be obtained. A whole document may be split up into smaller units, for each of the units the score can be obtained and the scores may finally be added to finally select the document with the highest score. Another possibility would be to choose the document for which a certain unit has returned the highest score.

Document retrieval can be such as to obtain a list of documents based on a score threshold (the best document(s)), it may be combined with a limit set by the user for the number of returned documents, or the like.

It should be understood here that the query selects certain columns of the bit attribute matrix, and for the selected columns some further logical operations may be performed in some embodiments which give a resulting score for the individual rows of the matrix formed by the selected columns. Based thereupon retrieval of documents can be performed taking into account the score obtained for the individual documents or parts thereof (such as pages, etcetera, as explained before).

One implementation of an embodiment is such that the BAM and all ist registers are stored columnwise, allowing that all of the above described operations are performed using the hardware supported bit-by-bit operations. This means that in one processor operation one can process simultaneously 32, 64 (or 128) pages at once, depending on the actual processor architecture.

If the matrix is stored column-wise, then it is also very easy to eliminate those columns where the query bitstring has a logical zero. Only those columns are used for the further processing where the corresponding bit in the query bitstring is set, and thereby the total number of columns can be easily reduced significantly and a new matrix is formed containing only those columns which have been selected as relevant by the query bitstring.

Once a sorted list of potential candidates has been established (based on the scores), in a further embodiment one may start a second phase which may further improve the result. The original text of the candidate documents in this phase is now directly compared with the original (textual) content of the query. This can be done word-wise, fragment-wise, and/or page-wise. The document scores can be obtained as a function of the page scores.

This detailed comparison can be done as follows. At first for each word in the query there is found a counterpart in each candidate document, the counterpart being the word which is most similar to the query word. If there is no identical word in the candidate document, then the difference between the query word and the most similar word in the candidate document is expressed by a score indicating the similarity degree. One possible score might be calculated on the Loewenstein-distance between the two words. Thereby an "othographic similarity score" may be obtained.

Then the sequential order of the query words can be compared with the sequential order of their counterparts in the candidate document. The result of this comparison again gives a sequential score indicating the sequential similarity.

Then the distance between the identified counterparts of the query words in the document candidate may also be taken into account to obtain a distance score, a high distance being punished.

Based on the orthographic similarity score, the sequential score and the distance score then there may be obtained a final similarity score which indicates the similarity between the candidate documents and the query. Based on this final similarity score then one or more final candidates may be selected for retrieval.

Of course other ways of calculating the final score are possible as well. The purpose of the calculation of the final score is to obtain a score which represents the similarity between the query and the documents obtained through the operations using the bit attribute matrix such that the most similar documents can be retrieved. Any similarity measure may therefore be used to get further information about how similar the query and the initially retrieved documents are in order to obtain a final score based on which the final retrieval judgment as to which documents actually are to be retrieved is made.

In comparison with the usual methods for full text indexing, the present embodiment has several advantages. It does not depend on the used language. For example, one does not need to load a list of stop-words (very frequent words whose function is to "glue" together a sentence). Such words lead to trigrams which are encountered so often that the corresponding columns in the BAM are "full"—such columns are automatically discarded because they do not help in eliminating candidates. Furthermore, one can use quite complex similarity measures to achieve a very good precision, since the initial step already significantly reduces the number of relevant candidates.

The described embodiments can further be varied in a manifold of ways.

By adding additional fields (columns) to the BAM one can, for example, enforce searching only on some subset of all examples. One such extended field could be the class of the document obtained through any classification engine which automatically classifies documents according to a classification scheme. The classification may be an neural network, it may also be a classification engine as described in European patent application with the application number 99108364.4 filed on Apr. 28, 1999 by the applicant of the present application. This application is hereby incorporated by reference as a whole.

By using such additional fields one can already initially concentrate the algorithmic efforts into the relevant part of the database, e.g. by eliminating those documents where the classification does not match with the query.

Since in the present embodiment the memory allocation happens columnwise, it is easy to extend a BAM in width (compared to adding further text and thus extending it in depth). Any search key index can be in this way added to the BAM, so that the system is able do perform also all desired data bank functions in a very flexible, extendable way.

The embodiments described create and handle internally a few big objects: one is a structured full text cache (which contains the stored documents as a whole) and the BAM itself. Such objects will have appropriate methods so that they can be loaded from a stream at initialization and saved into a stream when the associative memory is destroyed.

Apart from these functions, there is some further functionality related to storing. The cache administrator can send a document string to the engine required that it is stored. The same functionality is provided also for a whole set of documents.

In one embodiment, in response to sending a Query-document to the associative memory the user gets back a list of hits, and possibly their scores. Thereby not only similar documents can be found but also documents whose fragments are used for querying.

In a further embodiment there is provided a long list of options and parameters, making it flexible. A query can be sent with some optional parameters, specifying what the user is looking for, what kind of answer is expecting, and how fast. For instance, the user might want to look at the first found 20 relevant documents (and will have a fast answer).

In other cases it might want to find ALL relevant documents which can be found, no matter how long that might takes.

In one embodiment the results are sent back in packages, so the user has from the beginning what to do (while the associative memory crunches on). Another parameter instructs the engine WHAT to send back. One option is only URLs+confidence, the other one is URL+relevant text+confidence. The answer will contain a list, whose length is yet another possible query parameter, of such items. Other options are the setting of the allowed retrieval error (how precise the query words should be found in the retrieved documents) and the inclusion of attributes and keywords. An attribute is a special word which has been so defined during the storing command. A typical article should have an AUTHOR, AUTHOR-AFFILIATION, TITLE, PUBLISHER, DATUM, etc as possible attributes associated to it. The query with such attributes will be done only on the documents having such attributes and will do a fuzzy search for the content of the attribute. Another possible attribute is the classification attribute as defined through any classification engine.

The keywords play a different role: adding a (+/−) keyword will (de)select from the answer candidates those where these words can be exactly found.

Finally, in a further embodiment it is possible to refine a search by restricting the search to the already found documents.

According to a further embodiment an associative memory is used to generate a classification scheme for a classification engine. Assume that there is a large volume of unclassified data, then it may be difficult to find some datasets which are suitable to be used as a learning input to a classification engine making the engine to learn a certain classification scheme.

Using the associative memory this becomes very easy. One just generates a query document such that it is a typical representation of a desired class of the classification scheme. Sending this query to the associative memory one will obtain a set of documents being highly similar in content to the query document. Those documents can then be used to train the classification engine for that class or as new queries when the scope of the search is to be extended through iterations.

As already mentioned, a classification class can also be represented in the BAM as a feature, thereby refining the results obtained through the associative memory. In this manner a combination of a classification engine and associative memory can become extremely powerful. A classification can be incorporated into the BAM, this improves the associative retrieval, this can be used to improve the classification, e.g. by increasing the number of documents which belong to a certain class by assigning retrieved documents to a certain classification class, or by using the retrieved documents as a set of learning examples. The improved classification (either refined in accuracy by relearning or extended through additional classes or with expanded content in the classes through assigning) may be again (in whole or in part) be incorporated into the BAM (e.g. by adding further columns to the BAM), and so on. Using such an iterative process for a combination of a classification engine and an associative memory can then lead to a self-improving or self-learning system.

The continuous improvement may also start with the classification engine instead of the associative memory, e.g. by retrieving documents of certain classes, using them as query to the associative memory, using the query result the classification engine may be improved, and so on.

Figure 3:
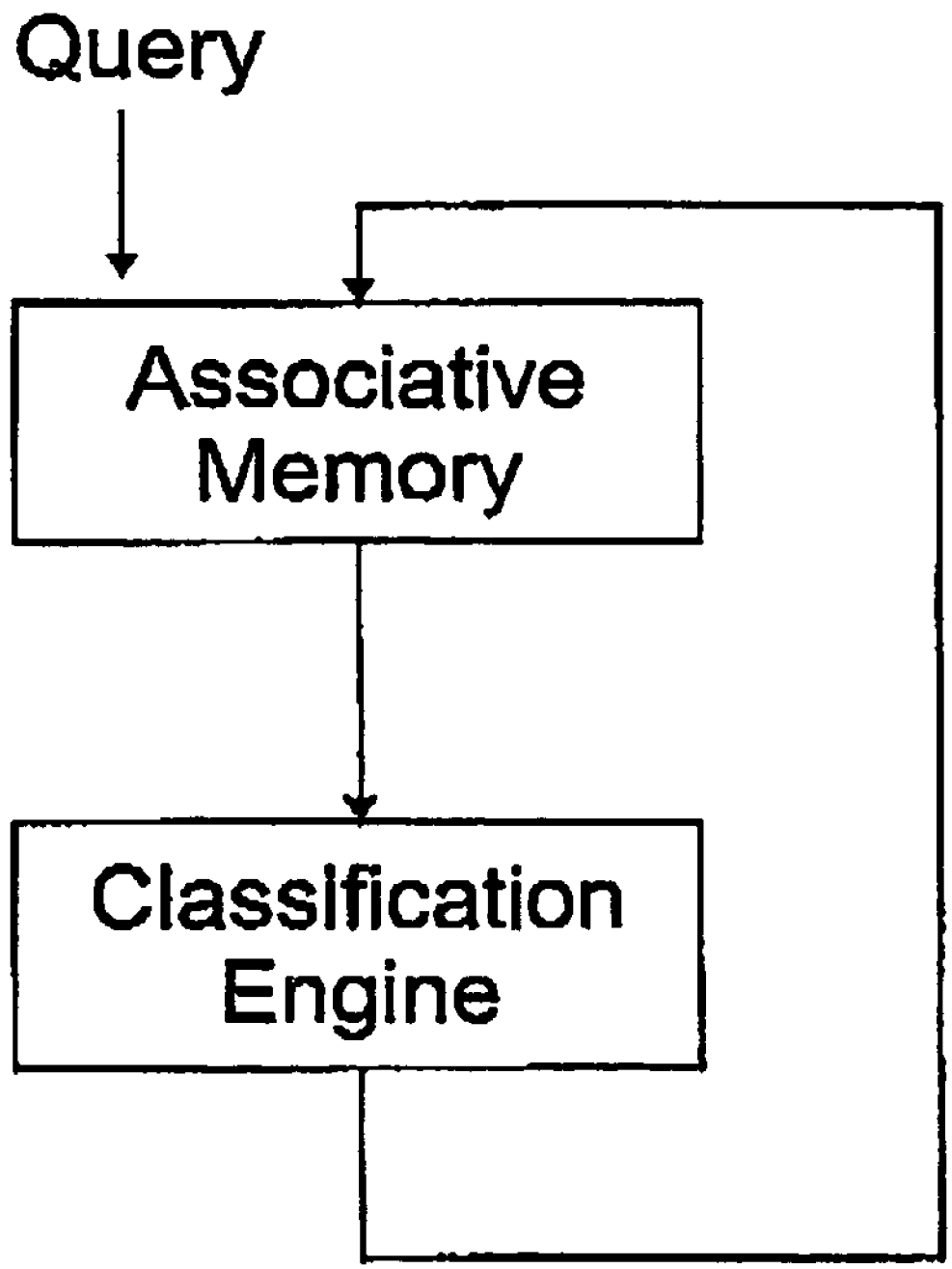

Alternatively a set of unknown documents may be classified using the classification engine, thereby the content of the engine (or the database) will increase, the so improved classification engine may be used again for associative retrieval, and so on. FIG. 3 schematically illustrates such a self-improving system This is applicable to any classification engine, e.g. a neural network. A particularly well suited classification engine would be the one described in European patent application with the application number 99108354.4 already mentioned before.

What is claimed is:

1. A computer-implemented method of realizing an associative memory capable of storing a set of documents and retrieving one or more of said stored documents similar to an inputted query document, said method comprising:
 coding each of said stored document or a part of it through a corresponding feature vector consisting of a series of bits which respectively code for the presence or absence of certain features in said document;
 arranging said feature vectors in a matrix;
 generating a query feature vector based on the query document and according to the rules used for generating the feature vectors corresponding to the stored documents such that the query vector corresponds in its length to the width of the matrix;

for those columns of the matrix where the query vector indicates the presence of a feature, bitwise performing one or more logical operations between the columns of the matrix to obtain one or more additional result columns coding for a similarity measure between the query and parts or the whole of the stored documents; and said method further comprising one or a combination of the following;

retrieval of one or more stored documents based on the obtained similarity measure; and or storing a representation of a document though its feature vector into the above matrix.

2. The method of claim 1, wherein there is a plurality of result columns which code a similarity score which is based on the following:

the number how often a certain feature or a set of features defined by the logical 1's in the query vector occurs within a row of the matrix.

3. The method of claim 1, wherein based on said similarity measure a set of candidate documents is chosen for further inspection, said set of candidate documents being further evaluated with respect to their similarity to the query documents being further evaluated with respect to their similarity measures reflecting the similarity between query and candidate under one or more aspects.

4. The method of claim 3, wherein based on said one or more further similarity measures there is obtained a final similarity measure based on which it is decided which documents are finally to be retrieved.

5. The method of claim 3, wherein said further inspection comprises comparing the query elements with the elements of the candidate documents to obtain one or more of the following further similarity measures:

a measure for the similarity between the textual query elements and textual document elements;

obtaining for each query element a corresponding textual document element based on said similarity measure;

obtaining measure for the degree of coincidence between the sequential order of the textual query elements and the sequential order of the corresponding textual document elements;

obtaining a measure for the similarity between the distance between elements in the query and the corresponding distance between elements in the document.

6. The method of claim 1, wherein results returned which lie above a certain similarity treshold, and/or wherein a user definable number of documents are retrieved which have the highest similarity.

7. The method of claim 1, wherein a desired degree similarity can be defined by the user to be:

identity;

an settable degree of similarity or a similarity treshold; and or identity for certain features and a settable degree of similarity for the other features.

8. The method of claim 1 wherein features coded by a feature vector for their presence or absence comprise one or more of the following;

unigrams, diagrams, multigrams, words, fragments of text, sentences, paragraphs, or a combination of them;

semantic classes reflecting a certain meaning which elements in the text to be represented may have;

concept classes reflecting an abstract concept to which elements in the text to be represented belong;

one or more classification classes classifying the document according to a classification scheme;

one or more attributes which may be assigned to a document.

9. The method of claim 8, wherein the classification classes or the attributes may be attributes of the documents such as Date, author, title, publisher, editor, topic of the text, or classification results form classifications by the user or by an automatic classification engine.

10. The method of claim 8, wherein the query document is assigned automatically an attribute or class based on the attribute or classes of one or more result documents obtained through the query according to one of the preceding claims.

11. The method of claim 1, wherein the matrix formed by the feature vectors representing the documents to be searched is stored column-wise, and wherein said method further comprises:

for those columns of the matrix where the query feature vector bit is set, performing a processor supported bitwise operation between the columns of the matrix to obtain one or more result columns, the values in the result columns representing the similarity between the query and the stored documents.

12. The method of claim 1, wherein there is a plurality of result columns such that the result columns form a matrix, and wherein a row of the thus formed result column matrix represents a degree of similarity between the query and the stored document corresponding to said row.

13. The method of claim 1 further comprising the steps of:

obtaining a set of examples for a certain classification class by carrying out a search for documents belonging to a particular class; and training a classification engine by said obtained set of examples as the learning input.

14. The method of claim 13, wherein said search for example documents is carried out in a subset of the set of stored documents, said subset being defined through the presence of one or more attributes or classification classes specified by the user in the query, thereby selecting for said query only the documents of said subset.

15. The method of claim 13, said method being applied to realize a self-improving system through the steps of retrieving relevant documents from a set of documents through an associative search;

using the retrieved documents from a set of documents through an associative search;

using the retrieved documents for improving a classification engine, using the classification through a classification engine to improve the retrieval through an associative memory; and using the improved retrieval to improve the classification engine.

16. An apparatus for realizing an associative memory capable of storing a set of documents and retrieving one or more stored documents similar to an inputted query document, said apparatus comprising:

means for carrying out a method of realizing an associative memory capable of storing a set of documents and retrieving one or more of said stored documents similar to an inputted query document, said method comprising:

coding each of said stored document or a part of it through a corresponding feature vector consisting of a series of bits which respectively code for the presence or absence of certain features in said document;

arranging said feature vectors in a matrix;

generating a query feature vector based on the query document and according tot he rules used for generating the feature vectors corresponding to the stored documents such that the query vector corresponds in its length to the width of the matrix;

for those columns of the matrix where the query vector indicates the presence of a feature, bitwise performing one or more logical operations between the columns of the matrix to obtain one or more additional result columns coding for a similarity measure between the query and parts of the whole of the stored documents; and said method further comprising one or a combination of the following:

retrieval of one or more stored documents based on the obtained similarity measure; and or storing a representation of a document though its feature vector into the above matrix.

* * * * *